United States Patent [19]

Beasom

[11] Patent Number: 4,923,820
[45] Date of Patent: May 8, 1990

[54] IC WHICH ELIMINATES SUPPORT BIAS INFLUENCE ON DIELECTRICALLY ISOLATED COMPONENTS

[75] Inventor: James D. Beasom, Melbourne Village, Fla.

[73] Assignee: Harris Corporation, Melbourne, Fla.

[21] Appl. No.: 311,812

[22] Filed: Feb. 17, 1989

Related U.S. Application Data

[62] Division of Ser. No. 777,269, Sep. 18, 1985, Pat. No. 4,807,012.

[51] Int. Cl.$^5$ .................. H01L 21/223; H01L 21/265; H01L 21/76; H01L 21/95
[52] U.S. Cl. .......................... 437/21; 437/38; 437/62; 437/90; 437/165
[58] Field of Search ........................ 437/62, 38, 81, 89, 437/90, 141, 160, 161, 162, 163, 164, 33, 21, 165

[56] References Cited

U.S. PATENT DOCUMENTS

| | | | |
|---|---|---|---|
| 3,722,079 | 3/1973 | Beasom | 437/62 |
| 3,800,195 | 3/1974 | Davidsohn | 357/49 |
| 3,865,649 | 2/1975 | Beasom | 437/54 |
| 3,976,511 | 8/1976 | Johnson | 437/24 |
| 3,979,237 | 9/1976 | Morcom et al. | 156/645 |
| 4,169,000 | 9/1979 | Riseman | 437/65 |
| 4,242,697 | 12/1980 | Berthold et al. | 357/49 |
| 4,290,831 | 9/1981 | Ports et al. | 437/62 |
| 4,309,715 | 1/1982 | MacPherson et al. | 357/37 |
| 4,380,865 | 4/1983 | Frye et al. | 437/62 |
| 4,481,707 | 11/1984 | Cunniff | 437/62 |
| 4,608,590 | 8/1986 | Hartman et al. | 357/38 |
| 4,624,047 | 11/1986 | Tani | 437/68 |
| 4,835,113 | 5/1989 | Celler et al. | 437/37 |

FOREIGN PATENT DOCUMENTS

| | | | |
|---|---|---|---|
| 57-58338 | 4/1982 | Japan | 437/62 |
| 58-197739 | 11/1983 | Japan | 437/62 |
| 59-17263 | 1/1984 | Japan | 437/62 |
| 59-218747 | 12/1984 | Japan | 437/62 |

*Primary Examiner*—Olik Chaudhuri
*Attorney, Agent, or Firm*—Barnes & Thornburg

[57] ABSTRACT

In integrated circuits having device island separated laterally by support of polycrystalline regions and a dielectric layer, a shield layer is provided along the side walls at the dielectric layer having an impurity concentration sufficiently greater than the island's impurity concentration to eliminate support bias influence without seriously affecting the PN junction in the island. The shield impurity concentration is less than the region forming a PN junction with the island and preferably is below $1 \times 10^{13}$ ions/cm$^2$ and a peak impurity concentration less than $5 \times 10^{16}$ ions/cm$^3$.

12 Claims, 2 Drawing Sheets

IC WHICH ELIMINATES SUPPORT BIAS INFLUENCE ON DIELECTRICALLY ISOLATED COMPONENTS

This is a divisional of application Ser. No. 06/777,269, filed Sept. 18, 1985, now U.S. Pat. No. 4,807,012, issued Feb. 21, 1989.

BACKGROUND AND SUMMARY OF THE INVENTION

The present invention relates generally to dielectrically isolated integrated circuits and more specifically to an improved dielectrically isolated integrated circuit.

Support bias can induce large depleted regions in high resistivity dielectrically isolated islands. The size of the depleted regions is dependent on bias voltage. They can interact with components in the islands, altering such characteristics as breakdown voltage and leakage current.

A known method which eliminates support bias influence on component characteristics is use of a wrap-around buried layer 16, 18 which is present adjacent all parts of the isolation oxide 14 as illustrated in FIG. 1. The layers used in the prior art were developed originally to minimize series resistance introduced by the high resistivity island 12 which include surface contact region 22. They were then applied in situations where shielding from substrate bias was desired. These layers, typically having a peak doping impurity concentration greater than $1 \times 10^{18}$ ions per cubic centimeter and a thickness of about 10 microns, eliminate the bias effect by providing sufficient impurity concentration to terminate for positive substrate bias or act as a source for negative substrate bias all field lines induced by the substrate bias.

The presence of the buried layer along the island side walls results in several problems. Components in the island must be spaced further from its edge than would be the case were the side wall layer not there. The spacing requirement arises both from the need to have junctions not overlap the side wall layer and from the need for a sufficient space to be maintained between any PN junction and the side wall layer to permit the desired breakdown voltage to be attained.

A device built in a dielectrically isolated island 12 having only a buried layer 16 is illustrated in FIG. 2. Junctions intended to have the same voltage capability in the two types of islands are illustrated in FIGS. 1 and 2. In many cases the spacing of a PN junction 20, 12 from the island edge must be increased by more than a factor of two to accommodate a side wall layer. One method to increase density in the chip is selectively forming the side wall layer for those devices which require collector resistance or connection to the buried layer. This is illustrated in U.S. Pat. No. 4,290,831 to Ports et al.

Reduction of breakdown voltage due to high fields induced by conductors lying above the side wall layer to island high-low junction is another problem which results from a side buried layer. There are known solutions to the problem such as very thick oxide over the junction, an extra doped surface layer which broadens the high-low transition region or field plates between the conductor and the high-low junction. They all require extra process complication and often require extra area, both of which increase cost.

An object of the present invention is to provide a wrap-around layer which shields components in a dielectrically isolated island from support bias effects without introducing the problems of the conventional wrap-around layer.

Another object is to provide a method of eliminating support bias influence on dielectrically isolated components without requiring extra process complication and extra area.

Yet another further object is to provide a dielectrically isolated island which is optimized for support influence elimination and packing density.

Still another object is to provide a support bias influence elimination structure which allows conductors to run over the edge of the island without inducing breakdown.

These and other objects are provided by using a shield layer of the same conductivity type as the dielectrically isolated islands adjacent the dielectric isolation and extending along the sides thereof having an impurity concentration sufficient to eliminate the support bias influence without seriously affecting the PN junction in the island. The impurity concentration of the shield region is greater than the impurity concentration of the island and less than $1 \times 10^{13}$ ions per square centimeter. The peak impurity concentration, which is adjacent the dielectric isolation, should be less than $5 \times 10^{16}$ ions per centimeter cubed. The shield layer along the bottom of the island may have the same impurity concentration as the side of the island or may have a greater impurity concentration. The impurity concentration of the shield region is higher than the impurity concentration of the dielectrically isolated island and lower than the impurity concentration of a region of opposite conductivity type formed in the dielectrically isolated island.

The side walls which are optimized for eliminating the support biasing effect is also applicable to device regions which are dielectrically isolated on the side walls and junction isolated on the bottoms.

The method of forming the shield region of the present invention controls the impurity concentration during the formation of the buried and side regions of the original island prior to the formation of the dielectric isolation layer to achieve the total concentration and peak concentration described above.

Other objects, advantages and novel features of the present invention will become apparent from the following detailed description of the invention when considered in conjunction with the accompanying drawings.

DETAILED DESCRIPTION OF THE DRAWINGS

Figure 1:
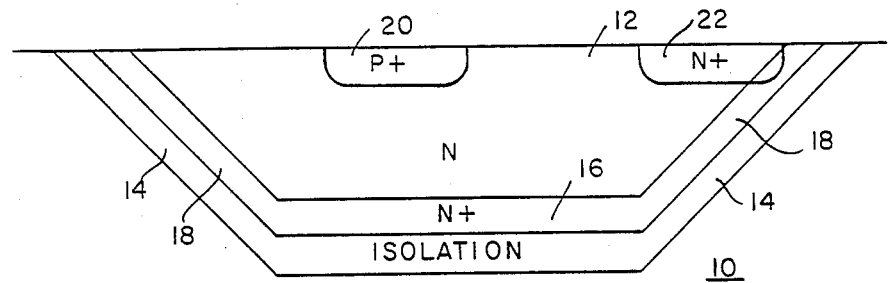
FIG. 1 is a cross-sectional view of a dielectrically isolated region of the prior art including high impurity concentration buried and side wall regions.
Figure 2:
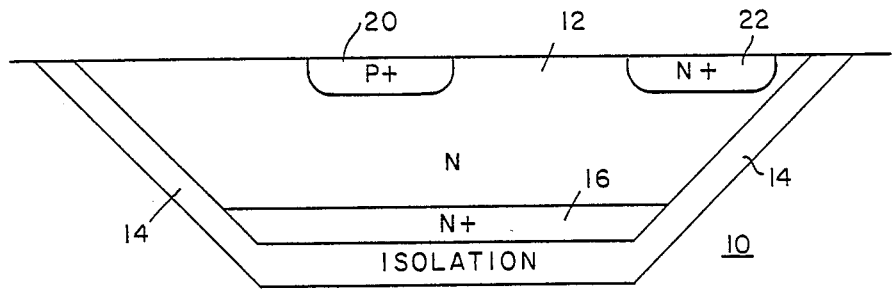
FIG. 2 illustrates a cross-section of a dielectrically isolated region of the prior art having only a buried high impurity concentration region.
Figure 3:
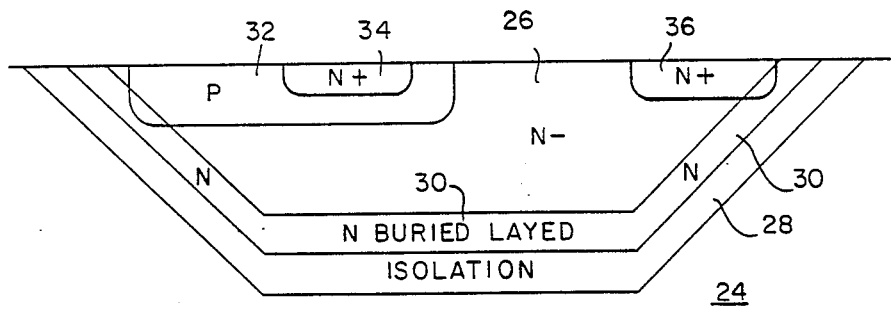
FIG. 3 is a cross-sectional view of a dielectrically isolated region incorporating the principles of the present invention.

A dielectrically isolated island as illustrated in FIG. 3 includes a support 24 having the use of an N− region 26 separated therefrom by a dielectric isolated layer 28. The region 26 is a semiconductor material, preferably a single crystal silicon, and the support 24 is preferably a polycrystalline silicon. An N shield layer 30 is provided along the sides and the bottom of the N− region 26 adjacent to the dielectric layer 28. A P-type conductivity region 32 is formed in the surface of the N− region 26 and an N+ region 34 is formed in a P region 32. An N+ region 36 is formed in the N− region 26. The structure as illustrated in FIG. 3 is a bipolar vertical transistor wherein the N− region 26 is a collector having surface collector contact 36, base region 32 and emitter region 34. The impurity concentration of the shield region 30 is chosen to have a total doping just sufficient to terminate the fields induced by the support 24 bias. A doping level of less than $1 \times 10^{13}$ ions per square centimeter will suffice and meet the requirements in most cases. This is in contrast to a concentration greater than $1 \times 10^{14}$ ions per square centimeter which is used in prior art buried layers 16, 18 as illustrated in FIGS. 1 and 2.

The peak concentration of the shield region 30, which in the preferred case has a graded concentration with the maximum at the dielectric isolation 28, is chosen to be lower than the peak concentration of any regions which form PN junctions with the island 26 as one of the terminals of the PN junction. In the embodiment of FIG. 3, the peak concentration of the P region 32 is generally in the range of $1 \times 10^{17}$ to $1 \times 10^{19}$ ions per centimeter cubed and, thus, the peak impurity concentration of shield region 30 should be less than $5 \times 10^{16}$ ions per centimeter cubed and is preferably less than $1 \times 10^{16}$ ions per centimeter cubed. The peak concentration of prior art side wall 18 is generally greater than $5 \times 10^{17}$ ions per centimeter cubed. As illustrated in FIG. 3, this allows the P region 32 to abut or partially overlap the side walls shield region 30 in situations where maximum voltage is not required for the junction for the 32, 26 junction. This results in a significant reduction in component area and, thus, increases packing density.

The formation of the low voltage junction of. FIG. 3 in integrated circuit with high voltage junctions are achievable using the present invention. FIG. 3 is generally in the 50V breakdown range.

A method of forming the shield region 30 along the bottom and the side walls is illustrated in U.S. Pat. No. 3,722,079 to Beasom which is incorporated herein by reference.

Choosing a shield layer total concentration less than $1 \times 10^{13}$ ions per centimeter cubed and a peak concentration less than $5 \times 10^{16}$ ions per centimeter cubed also allows conductors to run over the shield layer to island high-low junction without inducing breakdown. These numbers are consistent with known art values for special layers which are used to mitigate the transition from prior art high concentration buried layers to high resistivity islands. Thus, no extra process steps are required to allow use of high voltage conductors with the side wall layer as are required with prior art side wall layers.

In some applications a high conductivity buried layer is required in the bottom of the island and support bias shielding is also needed. These needs can be met by forming the desired buried layer in the bottoms of the islands then adding a side wall shield layer. Such an island is shown in FIG. 4 including side walls 30 and buried layer 38.

Figure 4:
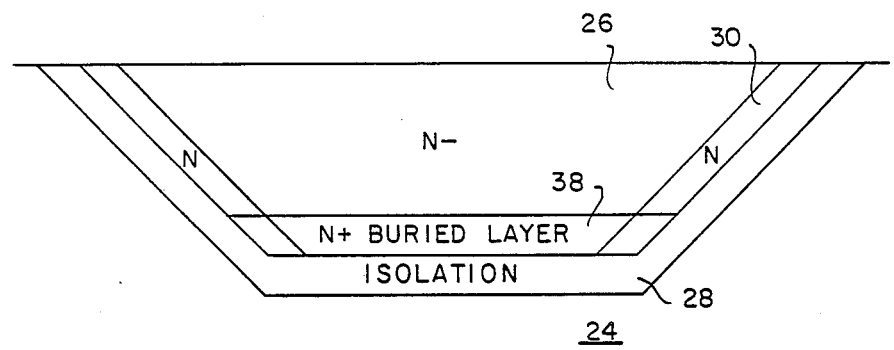
FIG. 4 is a cross-sectional view of a dielectrically isolated region incorporating the principles of the present invention including a buried high impurity concentration layer.

A particularly simple method to achieve the FIG. 4 structure is to form the bottom buried layer by one of the prior art methods before moats are etched. Such prior art method is illustrated in U.S. Pat. No. 3,865,649 to Beasom incorporated herein by reference. This is followed by forming the side wall layer after moat etch and before forming the dielectric layer.

Another way to achieve a higher conductivity in the bottom of the islands than on the sides is to use an ion implantation with the wafer approximately perpendicular to the implant beam. In this case the dose per unit area in the side walls is reduced due to the fact that they are at an angle to the ion beam. For the common case of (111) crystal plane side walls with a (100) orientation wafer, the side wall dose will be 82% that of the bottom.

Figure 5:
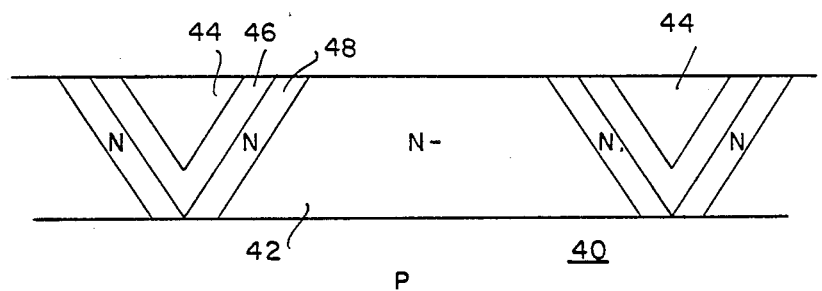
FIG. 5 is a cross-section of a polyplanar circuit incorporating the principles of the present invention.

The concept of the present invention by using a side wall which is designed to eliminate support bias without the accompanying disadvantages of a raised impurity concentration region at the surface may also be used on islands which are dielectrically isolated on the sides but not at the bottom. A typical example is the polyplanar isolated islands which is illustrated in FIG. 5 and includes a substrate P layer 40 and laterally dielectrically isolated N− region 42. A semiconductor region 44, for example, polycrystalline and dielectric layer 46 offer lateral dielectric isolation. The N shield region 48 is provided along the side walls of the N− region 42 and adjacent the dielectric layer 46. The method for forming the polyplanar structure of FIG. 5 is described in U.S. Pat. No. 3,979,237 to Morcom et al. The shield region 48 is formed after the moat etch and prior to the formation of the dielectric layer 46.

From the preceding description of the preferred embodiments, it is evident that the objects of the invention are attained, and although the invention has been described and illustrated in detail, it is to be clearly understood that the same is by way of illustration and example only and is not to be taken by way of limitation. Although the present invention is illustrated showing N-type islands, P-type islands work equally as well. The spirit and scope of the invention are to be limited only by the terms of the appended claims.

What is claimed is:

1. In a method of forming dielectrically isolated semiconductor islands including forming grooves in a bottom surface of a substrate of a first conductivity type and concentration, forming a dielectric layer on said bottom surface and said grooves, forming a semiconductor support on said dielectric layer and removing the top surface of said substrate sufficient to form dielectrically isolated islands in said support, the improvement comprising introducing impurities of said first conductivity type into at least said grooves before forming said dielectric layer to form a shield layer along at least said grooves having a total impurity concentration of less than $1 \times 10^{13}$ ions/Cm$^3$ and an impurity concentration; greater than said substrate and less than a region of a second conductivity type to be formed in said substrate as a PN junction.

2. In a method according to claim 1, wherein said impurities are introduced to form a shield layer having a peak impurity concentration of less than $5\times10^{16}$ ions/cm$^3$.

3. In a method according to claim 1, wherein said impurities are introduced to form a shield layer having a peak impurity concentration of less than $1\times10^{16}$ ions/cm$^3$.

4. In a method according to claim 1, wherein said impurities are introduced to form a graded shield layer with the peak concentration being at the surface of said grooves.

5. In a method according to claim 1, wherein said impurities are also introduced into said bottom surface to form a shield layer along the bottom of said island.

6. In a method according to claim 1, wherein said impurities are introduced by epitaxial growth.

7. In a method according to claim 1, wherein said impurities are introduced by ion implantation.

8. In a method according to claim 1, wherein said impurities are introduced by open tube deposition.

9. In a method of forming dielectrically isolated semiconductor islands including forming grooves in a bottom surface of a substrate of a first conductivity type and concentration, forming a dielectric layer on said bottom surface and said grooves, forming a semiconductor support on said dielectric layer and removing the top surface of said substrate sufficient to form dielectrically isolated islands in said support, the improvement comprising;
introducing impurities of said first conductivity type into at least said grooves before forming said dielectric layer to form a shield layer along at least said grooves having an impurity concentration greater than said substrate and less than a region of a second conductivity type to be formed in said substrate as a PN junction.; and
introducing impurities of said first conductivity type into only said bottom surface before forming said dielectric layer to form a buried layer having a higher impurity concentration than said shield layer.

10. In a method according to claim 9, wherein said buried layer impurities are introduced before forming said grooves.

11. In a method of forming dielectrically isolated semiconductor islands including forming grooves in a bottom surface of a substrate of a first conductivity type and concentration, forming a dielectric layer on said bottom surface and said grooves, forming a semiconductor support on said dielectric layer and removing the top surface of said substrate sufficient to form dielectrically isolated islands in said support, the improvement comprising introducing impurities of said first conductivity type into said groove and said bottom surface by ion implantation to simultaneously form a shield layer along said grooves and buried layer along said bottom surface having a higher impurity concentration than said shield layer, and said shield layer having an impurity concentration greater than said substrate and less than a region of a second conductivity type to be formed in said substrate as a PN junction.

12. In a method of forming dielectrically isolated semiconductor islands including forming grooves in a bottom surface of a substrate of a first conductivity type and concentration, forming a dielectric layer on said bottom surface and said grooves, forming a semiconductor support on said dielectric layer and removing the top surface of said substrate sufficient to form dielectrically isolated islands in said support the improvement comprising introducing impurities of said first conductivity type into only said grooves before forming said dielectric layer to form a shield layer only along said grooves having an impurity concentration greater than said substrate and less than a region of a second conductivity type to be formed in said substrate as a PN junction.

* * * * *